United States Patent [19]

Matsuzawa et al.

[11] 4,267,605
[45] May 12, 1981

[54] INTERFERENCE ELIMINATOR IN COMMUNICATION RECEIVER

[75] Inventors: Mitsuo Matsuzawa; Hajime Yashita, both of Tokyo, Japan

[73] Assignee: Trio Kabushiki Kaisha, Tokyo, Japan

[21] Appl. No.: 15,058

[22] Filed: Feb. 26, 1979

[51] Int. Cl.³ .......................... H04B 1/26; H04B 1/10
[52] U.S. Cl. .................................... 455/266; 455/296; 455/315
[58] Field of Search ............... 455/207, 266, 313–316, 455/296; 325/330, 345, 427, 431, 432, 433, 436, 473

[56] References Cited

U.S. PATENT DOCUMENTS

| | | | |
|---|---|---|---|
| 2,735,001 | 2/1956 | Witters | 325/432 |
| 2,747,084 | 5/1956 | Doelz | 325/432 |
| 2,998,517 | 8/1961 | Beckerich | 325/432 |

*Primary Examiner*—Jin F. Ng
*Attorney, Agent, or Firm*—Gerald J. Ferguson, Jr.; Joseph J. Baker

[57] ABSTRACT

In a communication receiver, a first mixing circuit, a first band-pass filter responsive to the output of the first mixing circuit, a second mixing circuit responsive to the output of the first band-pass filter, a second band-pass filter with a different center frequency from that of the first band-pass filter responsive to the output of the second mixing circuit, a first local oscillator, the output of which is applied to the first mixing circuit and a second local oscillator, the output of which is applied to the second mixing circuit. Various kinds of interference signals are eliminated by changing the output frequencies of the first and second local oscillators to thereby vary the effective bandwidth and center frequency of the signals which can pass through the receiver and thus eliminate interference. In addition, a third mixing circuit is responsive to the output of the second band-pass filter. The output of the third mixing circuit is applied to a notch filter, the notch frequency of which is effectively made variable by changing the frequency injected into the third mixing circuit and a demodulation circuit. Hence, by varying the effective notch frequency, further interference can be eliminated.

9 Claims, 8 Drawing Figures

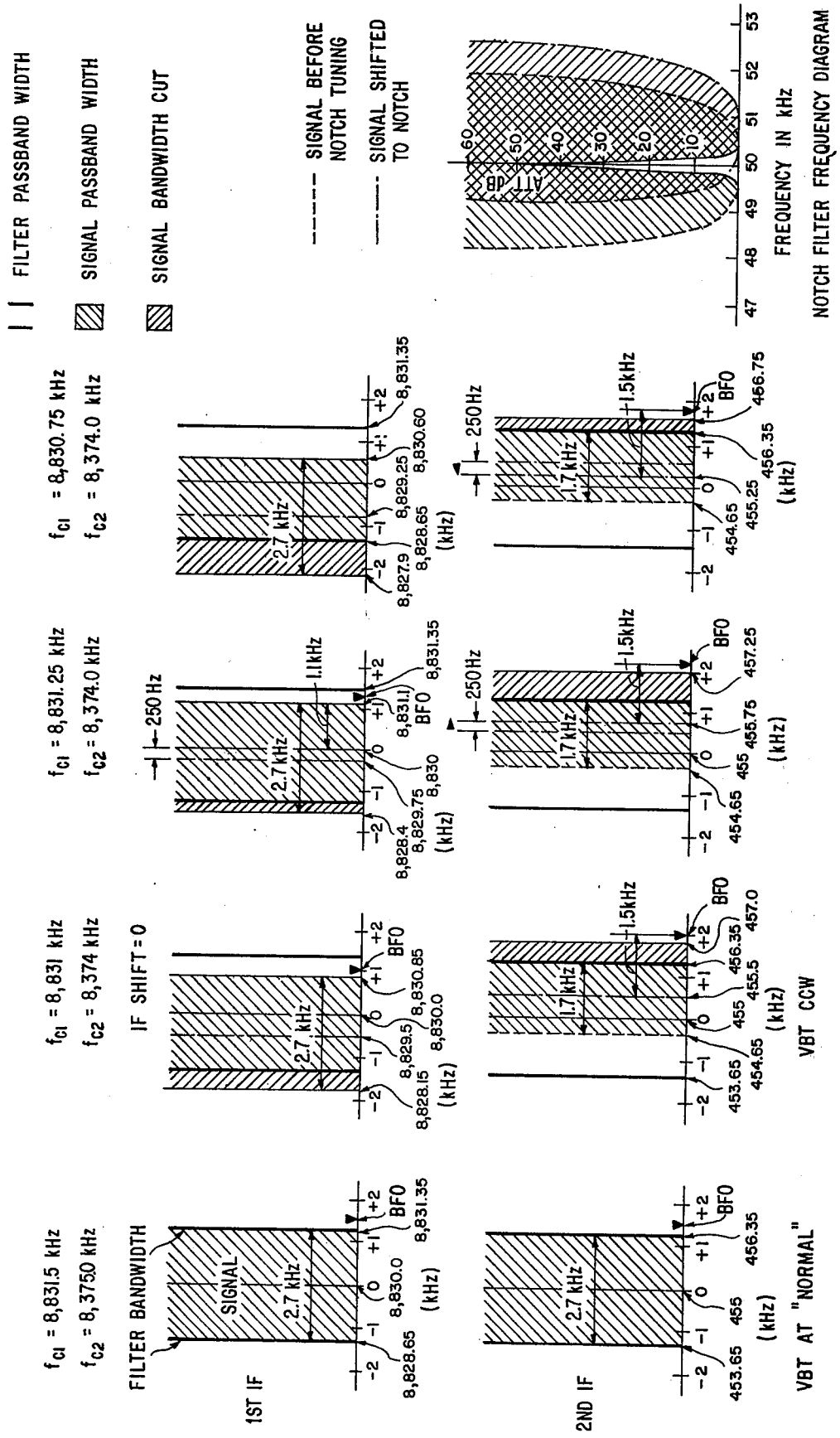

INTERFERENCE ELIMINATOR IN COMMUNICATION RECEIVER

BACKGROUND OF THE INVENTION

This invention relates to an interference eliminator that eliminates interference signals from communication receivers and, in particular, to an interference eliminator where the center frequency and the band width of the signals passed by the receiver are continuously variable.

In conventional communication receivers, measures have been taken in order to receive signals with a predetermined intelligibility in the presence of interference caused by cross signals from numerous stations within a narrow band. For example, one of the methods for eliminating the adjacent interference signals is to provide a plurality of crystal filters, etc. with good shape factors in the receiver and to select a desired filter in order to obtain desired receiver performance. However, this method has a shortcoming in that many filters are required which increase size as well as cost.

Another means used is to equip the communication receiver with an intermediate frequency shifting circuit, which freely shifts received signals within the filter band without changing the receiver tone during SSB or CW signal reception. FIGS. 1 through 3 are circuit diagrams of intermediate frequency stages of SSB receivers equipped with intermediate frequency shifting circuits.

In FIG. 1, a mixing circuit 1, an intermediate frequency filter 2 having a bandwidth of 5.645 MHz±4 KHz, a mixing circuit 3, an intermediate frequency filter 4 having a band width of 5.695 MHz±1.5 KHz, a mixing circuit 5, and a notch filter 6 with a notch frequency of 50 KHz are arranged in cascade connection. Outputs are injected from an oscillator 8 into mixing circuit 1, from an oscillator 10 with a 48.5 KHz center frequency into mixing circuit 3 and a detector circuit 7, from an oscillator 9 of 5.645 MHz into mixing circuit 5 thus comprising the intermediate frequency stage of a triple conversion system. $RF_{in}$ indicates a high frequency signal input and AF is a low frequency output. In this circuit, the SSB signal is inputted at 5.6465 MHz±1.5 KHz into the mixing circuit 3, inputted at 5.695 MHz±1.5 KHz into mixing circuit 5, and inputted at 50 KHz±1.5 KHz signal into notch filter 6 and detecting circuit 7.

In operation, the case will be considered where it is desired to eliminate interference waves that are approximately 1 KHz higher than the desired high frequency input signal. Since the first mixing circuit 1 utilizes a local oscillation frequency higher than the high frequency input signals, the output frequency of oscillator 10 is changed from 48.5 KHz to 48.0 KHz and the interference waves are converted to a frequency of 5.6935 MHz on the input side of intermediate frequency filter 4. The interference waves are thus eliminated by moving them below the lower end of the band width of intermediate frequency filter 4.

The circuit shown in FIG. 2 is also based on the same principle as that of FIG. 1. Mixing circuits 11, 13 and 15; an intermediate frequency filter 12 having a band width of 9.0115 MHz±4 KHz; an intermediate frequency filter 14 having a band width of 10.75 MHz±1.5 KHz; an oscillator 17 that injects an output into mixing circuit 11; and an oscillator 18 that injects an output into mixing circuits 13 and 15 comprise the intermediate frequency stage of a triple conversion system. In other words, oscillator 18 that injects an output into mixing circuits 13 and 15 is used in common and is separated from a beat frequency oscillator 19. Thus, the interference waves are eliminated by changing the output frequency of oscillator 18 making use of the skirt characteristic of intermediate frequency filter 14.

The circuit shown in FIG. 3 effects the principle illustrated with respect to FIG. 1 with an intermediate frequency stage of a single conversion system. A mixing circuit 21 and an intermediate frequency filter 22 comprise the single conversion intermediate frequency stage. The local oscillator circuit serving mixing circuit 21 is a phase-locked loop comprising a voltage control oscillator 24, a low-pass filter 25, a phase comparator 26, a mixing circuit 28, and an oscillator 29. A mixing circuit 30 is inserted into this phase-locked loop to use the local oscillator 31 serving the mixing circuit 30 in common with the beat frequency oscillator for detecting circuit 23 and to change the output frequency of the local oscillator 31. The interference waves are eliminated by shifting them outside the band of the intermediate frequency filter 22.

However, in the case of receivers having intermediate frequency shifting circuitry as shown in FIGS. 1 through 3 above, the circuitry is effective in eliminating an interference signal on only one side of the desired signal—that is, a frequency either higher or lower than the desired signal. However, when interference signals exist on both sides of the desired signal—that is, at frequencies higher and lower than the desired signal, the circuitry has a shortcoming in that it cannot eliminate both interference signals.

In addition, when the circuit of FIG. 1 is used, the interference signal which has been eliminated by notch filter 6 comes unhooked when the output frequency of oscillator 10 is changed and notch filter 6 has to be adjusted again.

SUMMARY OF THE INVENTION

The object is to provide an improved interference eliminator for a communication receiver without the above-mentioned shortcomings.

Other objects and advantages of this invention will be apparent from a reading of the following specification and claims taken with the drawing.

BRIEF DESCRIPTION OF THE DRAWING

FIGS. 7a–d and 8 are diagrams which further illustrate the operation of the invention.

DETAILED DESCRIPTION OF PREFERRED EMBODIMENTS OF THE INVENTION

Figure 1:
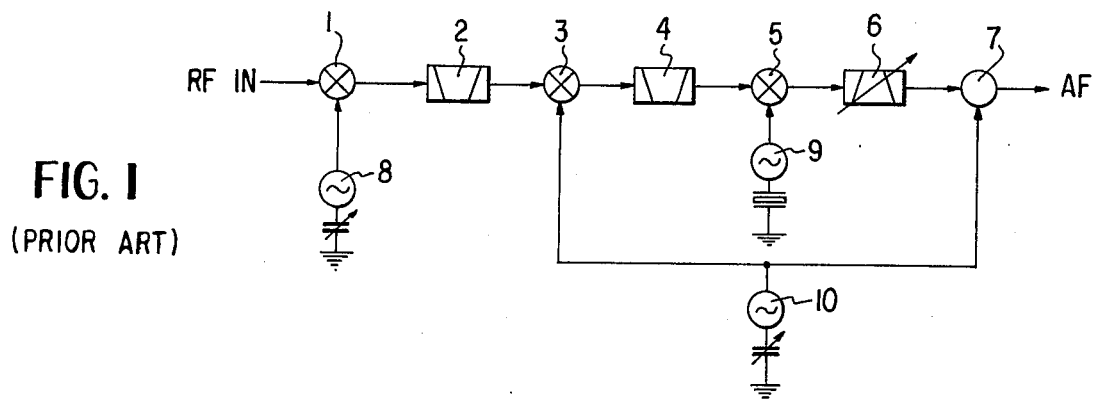
FIGS. 1 through 3 are circuit diagrams of intermediate frequency stages of SSB receivers having intermediate frequency shifting circuitry.
Figure 2:
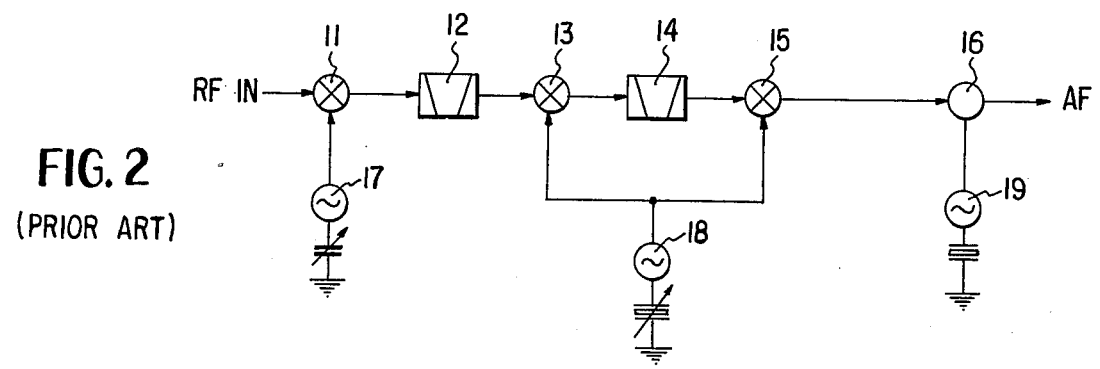
Figure 3:
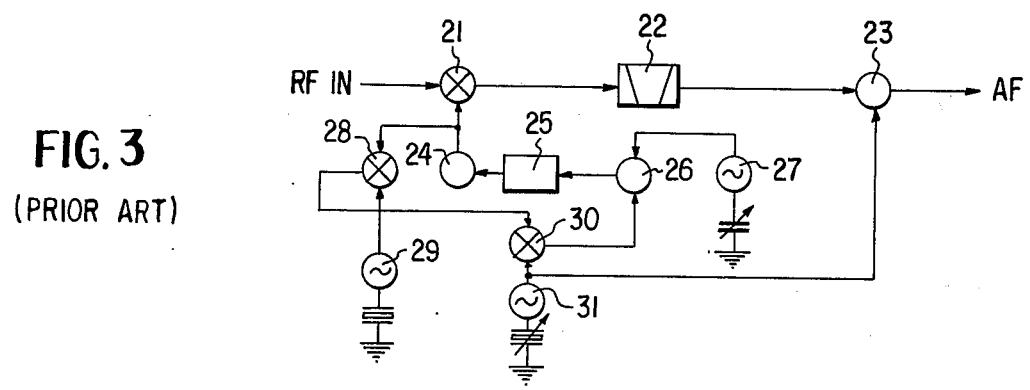

Reference should be made to the drawing where like reference numerals refer to like parts.

Figure 4:
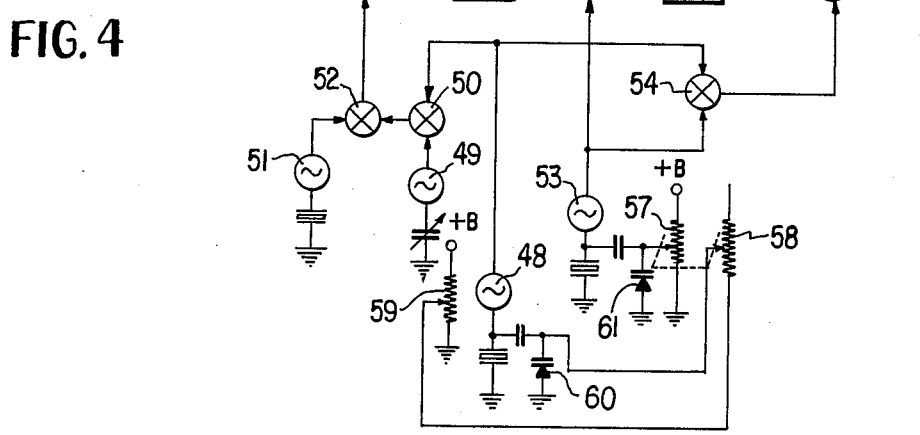
FIG. 4 is a circuit diagram of the intermediate frequency stage of an SSB receiver having an illustrative interference eliminator in accordance with one embodiment of the invention.

FIG. 4 is a circuit diagram of the intermediate frequency stage of an SSB receiver having an illustrative interference eliminator in accordance with one embodiment of the invention. 41 is a first mixing circuit that accepts the high frequency input; 42 is a first band-pass filter having an 8.830 MHz±1.2 KHz band width that is fed by the output of first mixing circuit 41; 43 is a second mixing circuit that accepts the output of first band-pass filter 42; and 44 is the second band-pass filter having a 455 KHz±1.2 KHz band width that is fed by the output of second mixing circuit 43. The foregoing comprise the intermediate frequency stage of a double-conversion system in an SSB receiver, for example, where 47 is a detecting circuit.

A first local oscillator comprises a first carrier frequency oscillator 48, variable frequency oscillator 49, a mixing circuit 50 that mixes the output frequency of first carrier frequency oscillator 48 and the output frequency of variable frequency oscillator (VFO hereinafter) 49, a heterodyne frequency oscillator 51 that generates a frequency corresponding to the frequency band being received and a mixing circuit 52 that mixes the output frequency of mixing circuit 50 and the output frequency of heterodyne frequency oscillator 51 and injects the output frequency into first mixing circuit 41.

The first carrier frequency oscillator 48 changes its output frequency according to the voltage impressed upon a variable capacitance diode 60, which is connected between ground and the slide of a variable resistor 58, which, in turn, is connected in series with the slide of a variable resistor 59. Resistor 59 is connected between the power supply +B and ground. When the voltage impressed on diode 60 is changed by changing the position of the slide of variable resistor 59 and the variable zone is set at a minimum of 500 Hz, the first carrier frequency oscillator 48 oscillates at an output frequency of 8.8315–8.8296 MHz at the upper side band reception, and 8.8282–8.8266 MHz at the lower side band reception.

As many heterodyne frequency oscillators 51 as there are receiving frequency bands of the receiver are employed and they are utilized by switching the receiver frequency band. For example, when receiving on the 14 MHz band, a heterodyne frequency oscillator 51 with an output frequency of 19.5 MHz is outputted to mixing circuit 52. The VFO 49 oscillates output frequencies ranging between 5.5–5.0 MHz.

A second local oscillator comprises a second carrier frequency oscillator 53. The second carrier frequency oscillator 53 provides an output frequency ranging 8.3750–8.3731 MHz by changing the voltage impressed upon a variable capacitance diode 61, which voltage is varied by changing the position of the slide of a variable resistor 57 and injects the output frequency into second mixing circuit 43. Variable capacitance diode 61 is connected to the slide of variable resistor 57 which, in turn, is connected between the power supply +B and ground and is interlocked with variable resistor 58. The output frequency of first carrier frequency oscillator 48 and the output frequency of second carrier frequency oscillator 53 are mixed at a mixing circuit 54 and the output of mixing circuit 54 is impressed upon detecting circuit 47.

In the above circuit, when the output frequency of first carrier frequency oscillator 48 is denoted as $f_{C1}$, the output frequency of VFO 49 as $f_{VFO}$, the output frequency of heterodyne frequency oscillator 51 as $f_{HET}$ and the output frequency of second carrier frequency oscillator 53 as $f_{C2}$, the output frequency of first local oscillator, $f_{L1}$, injected into first mixing circuit 41 becomes $$f_{L1} = f_{C1} - f_{VFO} + f_{HET},$$

and the output frequency of second local oscillator $f_{L2}$ injected into second mixing circuit 43 becomes $$f_{L2} = f_{C2}.$$

When the lower frequency limit of the output frequency of first mixing circuit 41 is made to correspond to the lower frequency limit of the band width of first band-pass filter 42 and the upper frequency limit of the output frequency of second mixing circuit 43 to the upper frequency limit of the band width of second band-pass filter 44 and when the center frequency of a range of high frequency input signals to first mixing circuit 41 is denoted as $f_C$ and the band width of the high frequency input signals, as $f_B$, $$f_C = (f_{HET} - f_{VFO}) + f_{C1} - \tfrac{1}{2} f_B - 8.8288 \text{ MHz} \quad (1)$$

$$f_B = f_{C2} - 8.3726 \text{ MHz} \quad (2)$$

result.

Center frequency $f_C$ is that of a range of received signals that pass an imaginary, composite filter that combines first and second band-pass filters 42 and 44, the center frequency $f_C$ being converted to the high frequency input side of first mixing circuit 41. $f_B$ is the effective bandwidth of first and second band-pass filters 42 and 44 as well as the bandwidth of the signal pass-band that passes the composite filter. This bandwidth is also converted to the high frequency input side of first mixing circuit 41.

A term $\tfrac{1}{2} f_B$ exists in the above equation (1). However, when the output frequency of second carrier frequency oscillator 53, $f_{C2}$, is changed by moving the slide of variable resistor 57 in order to set the bandwidth $f_B$, the output frequency of first carrier frequency oscillator 48, $f_{C1}$ preferably also changes. Thus, the center frequency $f_C$ does not vary because the change in $\tfrac{1}{2} f_{B1}$ in equation (1) cancels the change in $f_{C1}$. However, the center frequency $f_C$ can be set independently of $f_B$ by setting the output frequency of first carrier frequency oscillator 48.

As stated above, the bandwidth $f_B$ is set by setting the output frequency of second carrier frequency oscillator 53. Therefore, by setting the output frequencies of first and second carrier frequency oscillators 48 and 53, $f_{C1}$ and $f_{C2}$, the received signals shift within the bands of first and second band-pass filters 42 and 44 and the effective bandwidths of first and second band-pass filters 42 and 44 are in effect, combined into an equivalent, composite bandwidth, the edges of which can be equally changed—that is, the upper and lower limits thereof can be equally and simultaneously changed. Thus, interfering signals on both sides of a desired receiving signal at the input side of first mixing circuit 41—that is, those with frequencies higher and lower than the frequency of the desired signal can be eliminated.

The foregoing will now be explained with a specific example. Reception of the SSB upper side-band of 14.0015 MHz is assumed. If a bandwidth $f_B$ of 2 KHz is desired, the output frequency of the second carrier frequency oscillator 53, $f_{C2}$, is set at 8.3746 MHz. The output frequency of heterodyne frequency oscillator 51, $f_{HET}$, when reception occurs on the 14.000 MHz band, is 19.5 MHz and the output frequency of VFO 49, $f_{VFO}$, is 5.5 MHz. The output frequency of first carrier frequency oscillator 48, $f_{C1}$, is set at 8.8315 MHz. A center frequency $f_C = 14.0017$ MHz results and a shifting of 0.2 KHz is effected.

Figure 5:
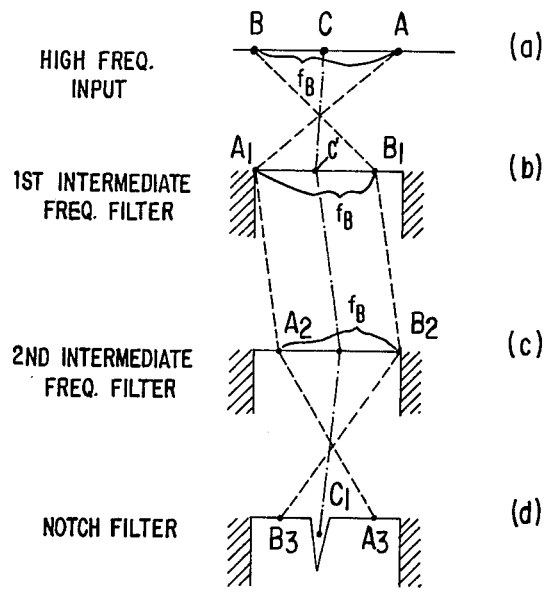
FIG. 5 is a diagram which illustrates the operation of the invention.

In FIG. 5(a), B is a 14.0007 MHz reception signal and A is a 14.0027 MHz reception signal, both of which pass first and second band-pass filters 42 and 44. That is, when these signals are converted at first mixing circuit 41 and inputted to first band-pass filter 42, the frequencies become $A_1 = 8.8288$ and $B_1 = 8.8308$ MHz as shown in FIG. 5(b). Thus, interference waves at frequencies above 14.0027 MHz are eliminated below the lower limit of first band-pass filter band. The frequency of the signals converted at second mixing circuit 43 and inputted into second band-pass filter 44 are $A_2 = 454.2$ KHz and $B_2 = 456.2$ KHz as shown in FIG. 5(c). Thus, interference waves at frequencies below 14.0007 JHz exceed the upper limit of second band-pass filter 44 band and are eliminated.

Hence, first and second band-pass filters 42 and 43 are in effect a composite band-pass filter with a $\pm 1$ KHz bandwidth and the interfering signals can be eliminated even when they occur on both sides of the desired signal. In addition, since the output frequencies of first and second carrier frequency oscillators 48 and 53, $f_{C1}$ and $f_{C2}$, are mixed and impressed upon detecting circuit 47, the relationship between the SSB signal and the output frequency of mixer 54 does not change. Hence, SSB signals are detectable.

Figure 6:
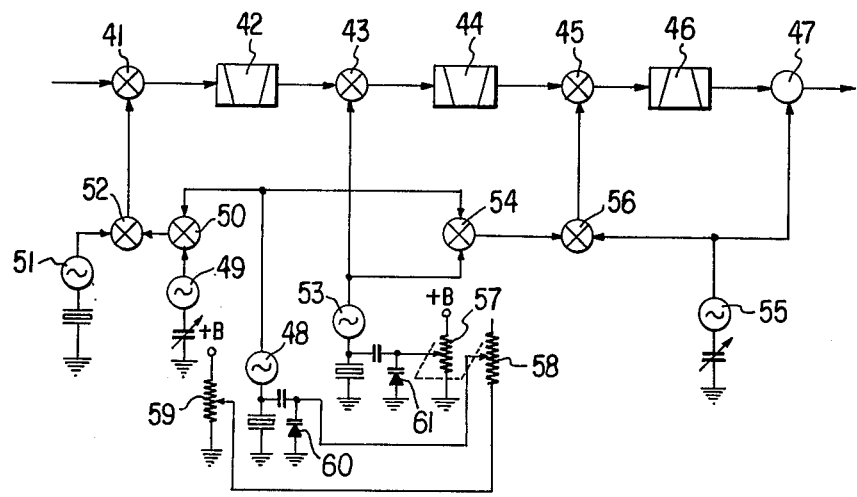
FIG. 6 is a circuit diagram of the intermediate frequency stage of an SSB receiver having an illustrative interference eliminator in accordance with a further embodiment of the invention.

FIG. 6 is a circuit diagram of the intermediate frequency stage of an SSB receiver having an illustrative interference eliminator in accordance with a further embodiment of this invention. Elimination of interference signals is enhanced by adding a notch filter to the embodiment shown in FIG. 4. In particular, a third mixing circuit 45 and a notch filter 46 with a fixed notch frequency of 50 KHz are connected between second filter 44 and detecting circuit 47. The output frequency of mixing circuit 54 and the output frequency of a third carrier frequency oscillator (BFO hereinafter) 55 that applies its output to detecting circuit 47, are mixed by mixing circuit 56. The output frequency of mixing circuit 56 is applied to third mixing circuit 45.

The center frequency and bandwidth of the composite filter that combines first and second band-pass filters 42 and 44 are made variable by changing the respective output frequencies of first carrier frequency oscillator 48 and second carrier frequency oscillator 53, $f_{C1}$ and $f_{C2}$, and interfering signals on both sides of the desired signal are eliminated. A detailed explanation is omitted since the operation is identical to that of the embodiment shown in FIG. 4. In addition, interference signals can be eliminated by notch filter 46 and third mixing circuit 45.

When the notch frequency of notch filter 46 is denoted as $f_N$, the notch frequency on the high frequency input side of first mixing circuit 41 corresponding to the notch frequency $f_N$ is denoted as $f_{RFN}$ and the output frequency of BFO 55 is denoted as $f_{C3}$, $$f_{RFN} = f_N + (f_{HET} - f_{VFO}) - f_{C3} \quad (3)$$

results. The notch frequency $f_{RFN}$ can thus be independently set to the output frequencies of first and second carrier frequency oscillators 48 and 53, $f_{C1}$ and $f_{C2}$. $f_{HET}$ and $f_{VFO}$ in the equation are the output frequencies of heterodyne frequency oscillator 51 and the VFO 49. Hence, interference signals in the band of the received signal on the high frequency input side can be eliminated by changing the output frequency of BFO 55, $f_{C3}$. Thus, in spite of the fact that notch frequency $f_N$ is fixed at 50 KHz, the notch frequency $f_{RFN}$ is variable.

The elimination of interference signals related to the notch frequency will now be specifically described using the practical example employed with respect to FIG. 4. Referring to FIG. 5(a), assume reception at 14.0015 MHz with a band-width of $\pm 1$ KHz and an interference signal of 14.0020 MHz. The output frequency of BFO 55 is set as $f_{C3} = 48.0$ KHz, and a notch frequency of $f_{RFN} = 14.0020$ MHz results. The interference signal at 14.0020 MHz becomes 50 KHz at the output of third mixing circuit 45, which coincides with the 50 KHz notch frequency $f_N$. It is thus eliminated by notch filter 46. In this case, the output frequencies of the second mixing circuit 43, $A_2 = 454.2$ KHz and $B_2 = 456.2$ KHz become respectively $B_3 = 48.7$ KHz and $A_3 = 50.7$ KHz and only the 50 KHz signal at the notch frequency is eliminated without affecting the other frequencies. In addition, in this embodiment also, the relationship between the SSB signals and the BFO output frequency does not change and the signals are detectable.

Thus, the circuitry of FIG. 6 comprises three different means for rejecting undesirable signals: namely, (1) intermediate frequency (IF) shift, (2) variable bandwidth tuning (hereinafter VBT) and (3) a notch filter. Each of these three means, taken alone, has been employed in conventional receivers. Further, a combination of both IF shift and a notch filter have been employed in the receiver of FIG. 1.

The receiver of the present invention employs at least IF shift and VBT (FIG. 4). Further, in accordance with the present invention, all three of the above interference eliminating means can be independently employed to enhance rejection of undesirable signals.

To further illustrate the operation of the circuitry of FIGS. 4 and 6, another illustrative example of the invention will now be given where the bandwidth of filters 42 and 44 is 2.7 KHz rather than 2.4 KHz.

First, the VBT circuit will be further illustrated. The VBT circuit functions to continuously change the IF filter passband by equivalently crossing the passbands of the first (8.83 MHz) and second IF (455 KHz) filters 42 and 44. Since the passband center frequency remains unchanged, the IF passband can be IF shifted without changing its center frequency, or the filter's passband (center frequency) can be shifted to an optimum point while maintaining the set VBT passband. Thus, interference signals can be markedly eliminated.

Assume a 14.00 MHz USB signal is received at the antenna. Under "normal" operating conditions, oscillator 53 ($f_{C2}$) is set to 8,375 KHz, VFO 49 is set to 5.5 MHz, oscillator 48 ($f_{C1}$) to 8,831.5 KHz and oscillator 51 (HET) to 19.5 MHz. Thus, oscillator injection to mixer 41 is 22.8315 MHz, and the SSB signal with 14.0015 MHz center frequency is converted by mixer 41 to an SSB signal with a 8.830 MHz center frequency (22.8315 − 14.0015 = 8.8300). This signal is further converted to 455 KHz by second mixer 43 and to a 50 KHz by third mixer 45. Variable bandwidth is controlled by adjusting variable resistor 57.

As can be seen in FIG. 7(A), for "normal" operation, the signal passband width $f_B$ equals the passband widths of filters 42 and 44—that is, 2.7 KHz where $f_B = f_{C2} - f_R$, $f_R$ being that frequency which will cause the "normal" operation $f_B$ when $f_{C2}$ is set to its "normal" operation frequency. Thus, in equation (2), $f_R = 8.3726$ MHz whereby $f_B = 2.4$ KHz (the passbands of filters 42 and 44 for the case assumed with respect to equation (2)) when $f_{C2}$ equals its "normal" operating frequency of 8.3750 MHz. Hence, when the passbands of filters 42 and 44 are equal, $f_M$ equals the difference between $f_{C2}$ and the passband of one of the filters 42 and 44. In the case assumed for FIG. 7, $f_M$ thus equals the difference between 8,375.0 KHz and 2.7 KHz or 8.3723 MHz or $$f_B = f_{C2} - 8.3723 \text{ MHz} \tag{4}$$

Further, $f_C$ is more generally equal to $(f_{HET} - f_{VFO}) + f_{C1} - \frac{1}{2} f_B - f_S$ where $f_S$ equals for USB reception the lower frequency limit of the passband for filter 42. Hence, in the case of FIG. 7

$$f_C = (f_{HET} - f_{VFO}) + f_{C1} - \frac{1}{2} f_B - 8.82865 \text{ MHz} \tag{5}$$

In particular, $f_C = 14.00150$. Hence, the center frequency $f_C$ of the passband or range of signals passed by filters 42 and 44 for the "normal" operation of FIG. 7(A) equals the established 14.00150 MHz center frequency for a 14.00 MHz USB signal.

As stated above, FIG. 7(A) shows the characteristics of filters 42 and 44 and the signal status for normal conditions where oscillator 53 ($f_{C2}$) is set to 8,375 KHz and oscillator 48 ($f_{C1}$) to 8,8315 KHz. The filter characteristics coincide with the signal and the passband is 2.7 KHz. FIG. 7(B) shows oscillator 53 set to 8,374 KHz via variable resistor 57 and oscillator 48, which is interlocked with variable resistor 57 via variable resistor 58, set to 8,831 KHz. In this instance, with variable resistor 57 so set, the signal passing through filter 42 is shifted down by 500 Hz. The bandwidth of the signal passing through this 8,830 KHz filter is 8,828.65−8,830.85 KHz, or 500 Hz narrower than the "normal" condition of FIG. 7(A). Thus, the effective filter bandwidth becomes 2.2 KHz, the output signal applied to mixer 43 having a frequency of 8,829.75 KHz±1.1 KHz. The signal passing through the 455 KHz filter 44 becomes 455.5 KHz±850 Hz—the effective bandwidth of the signals passing through filters 42 and 44 therefore being 1.7 KHz whereby signals outside this bandwidth can be eliminated.

It can be seen that the foregoing analysis agrees with equation (4) in that $f_B = 8,374.0$ KHz $-8,372.3$ KHz $= 1.7$ KHz. Further, $f_C = (19.5$ MHz $-5.5$ MHz$) + 8.8310$ MHz $- 0.00085$ MHz $- 8.82865$ MHz $= 14.0015$ MHz. Hence, the center frequency of the signal passband at the input side of mixer 41 remains unchanged with respect to that for the "normal" operation of FIG. 7(A) even though the IF center frequency shifts. Further, the bandwidth is equally reduced on both sides of this center frequency so that the signal passband is now 14,001.5 KHz±1.7 KHz. Hence, interference signals on both sides of the 14.0015 MHz USB signal can be simultaneously eliminated by filters 42 and 44 by appropriately setting $f_{C2}$. As stated above, because of the interlocking or ganging between variable resistors 57 and 58, it is possible to change $f_B$ without changing $f_C$ as has now been illustrated with respect to FIG. 7(B).

Since oscillator 55 of FIG. 6 produces a 48.5 KHz (USB) BFO signal (a 51.5 KHz BFO signal being produced for the LSB signal), the mixer 56 output in the case of FIG. 7(B) is $(8,831.0 - 8,374.0) + 48.5 = 505.5$ KHz. Thus, the signal at the output of filter 44 (455.5 KHz±850 Hz) is converted to a 50 KHz±850 Hz signal by third mixer 45. The difference frequency between the outputs of oscillators 48 ($f_{C1}$) and 53 ($f_{C2}$) $(8,831.0 - 8,374.0)$ is 457.0 KHz, which is a carrier frequency 1.5 KHz higher than the center frequency of the signal passband (455.5 KHz±850 Hz) passed by filter 44. Since the relationship between this center frequency and the carrier remains the same, the effective or composite characteristic of filters 42 and 44 is such that only the bandwidth is narrowed to 1.7 KHz while the effective center frequency thereof, is not changed, as discussed above.

FIG. 7(C) shows how variable resistor 59 can independently set oscillator 48 ($f_{C1}$) to 8,831.25 KHz with the VBT control 57 positioned as in FIG. 7(B) to effect IF shift in combination with VBT. In particular, once the optimum bandwidth has set as in FIG. 7(B), the IF can be shifted as in FIG. 7(C) for maximum intelligibility, this shift occurring independently of the VBT. Since oscillator 48 was set to 8,831.0 KHz in FIG. 7(B), the signal center frequency is 250 Hz higher than when variable resistor 59 (the IF shift control) was centered as in FIG. 7(B). In the case of FIG. 7(C), the signal bandwidth through filter 42 is 8,828.65−8,831.1 KHz or 2.45 KHz (8,829.875 KHz±1.225 KHz), which is 250 Hz narrower than the "normal" bandwidth of FIG. 7(A). The signal through filter 44 is the same as in FIG. 7(B)—that is, 455.50 KHz±850 KHz. However, the difference frequency (8,831.25−8,374.0) between the outputs of oscillators 48 and 53 are now 457.25 KHz which is a carrier frequency 1.75 KHz higher than the unshifted effective center frequency of filter 44 (that is, 455.50 KHz), rather than 1.50 KHz higher as was the case in FIGS. 7(A) and (B). Hence, even though the bandwidth is still 1.7 KHz, and the effective shifted filter center frequency is shifted +250 Hz to 455.75 KHz as shown in FIG. 7(C) to thereby effect the requisite 1.5 KHz difference between the signals applied to demodulator 47 of FIG. 4, for example, and thus demodulate the USB signal. FIG. 7(D) shows the 1.7 KHz bandwidth as in FIG. 7(C), but with the center frequency shifted —250 Hz.

Using formulas (4) and (5), it can be seen that in FIG. 7(C), $f_B = 8,374.0$ KHz $-8,372.3$ KHz $= 1.7$ KHz and that $f_C = (19.5$ MHz $-5.5$ MHz$) + 8.83125$ MHz $-0.00085$ MHz $-8.82865$ MHz $= 14.00175$, the foregoing also demonstrating that $f_B$ remains unchanged with respect to FIG. 7(B) and that $f_C$ is shifted by +250 KHz.

Although the circuitry of FIG. 6 is such that its various oscillators can be adjusted by the VBT and IF SHIFT circuits, the frequency relationship of the mixer 56 signal remains constant, providing the oscillator 55 frequency is at "normal". The output of oscillator 55 is mixed with mixer 54 output through mixer 56 and is fed to third mixer 45. The third mixer output frequency is constant even when the output frequencies of oscillators 48 and 53 are varied.

The third IF signal center frequency can be varied by changing the frequency of oscillator 55. The audio output pitch remains constant. The notch circuit functions when the 50 KHz (center frequency) filter 46 is actuated as shown in FIG. 8. Since the notch filter frequency is constant, the frequency of oscillator 55 is varied to shift the third IF center frequency so the interfering signal (CW, heterodyne, etc.) is at exactly 50 KHz. This process eliminates the interference and assures a stabilized notch filter characteristic.

As explained above, when this invention is used, the center frequency of the signals which pass two band-pass filters in cascade connection with different center frequencies can be shifted and the bandwidth of the composite filter that combines the two band-pass filters can be varied. Thus, wide range filter characteristics can be obtained. Further, an even wider range of filter characteristics can be obtained by utilizing a notch filter.

When the shifting of the above-mentioned center frequency of the receiving signals is combined with the equally variable bandwidth, various interference signals can be eliminated, thus resulting in a most optimum state of reception. Also, by combining filter characteristics, interference eliminators for receiving SSB, CW, RTTY or AM can be easily made. The above-mentioned advantages are achieved by combining basically two filters, which also is advantageous with respect to size and in its effect on improving the utility of communications receivers.

What is claimed is:

1. An interference eliminator for use in a communication receiver for eliminating interference from a high frequency input signal applied to the receiver, the high frequency input signal extending over a first range of frequencies, said interference eliminator comprising a first mixing circuit responsive to the high frequency input signal for providing a first intermediate frequency signal, a first band-pass filter responsive to the first intermediate frequency signal, a second mixing circuit responsive to the output of said first band-pass filter for providing a second intermediate frequency signal, a second band-pass filter having a center frequency different from the center frequency of said first band-pass filter and responsive to the second intermediate frequency signal, a first local oscillator connected to said first mixing circuit for applying a first local oscillator signal thereto, a second local oscillator connected to said second mixing circuit for applying a second local oscillator signal thereto, the relationships between the frequency of said first local oscillator signal to the center frequency and band-pass of the first band-pass filter and the frequency of said second local oscillator signal to the center frequency and band-pass of the second band-pass filter normally being such that the range of frequencies of said high frequency input signal effectively passed by said first and second band-pass filters after conversion by said first and second mixing circuits is such that (a) at least all of said first range of frequencies of the high frequency input signal are effectively passed by the first and second band-pass filters and (b) the center frequency of the range of frequencies effectively passed by the filters is substantially equal to the center frequency of the first range of frequencies, first control means for simultaneously changing said first and second local oscillator frequencies only when said second local oscillator is controlled to change said second local oscillator frequency so that the ratio of the amount of frequency change in said first local oscillator frequency to that in said second local oscillator frequency is 1:2 thereby (a) a reduced range of frequencies of the high frequency input signal is effectively passed by the filters which is less than said first range of frequencies and (b) the center frequency of the reduced range of frequencies effectively passed by the filters is substantially equal to the center frequency of the first range of frequencies, second control means for changing said first local oscillator frequency without changing the frequency of said second local oscillator so that the center frequency of the reduced range of frequencies effectively passed by the filters is shifted with respect to the center frequency of the first range of frequencies, and a third mixing circuit responsive to the output of said second band-pass filter, a notch filter having a fixed notch frequency responsive to the output of said third mixing circuit and a third local oscillator connected to said third mixing circuit and means for changing the output frequency of said third local oscillator to thereby vary the frequency of the output signal of said third mixing circuit so that an undesired signal can be eliminated by the notch of said notch filter whereby the notch frequency of said notch filter is effectively varied.

2. An interference eliminator as in claim 1 where the first local oscillator includes a first carrier frequency oscillator that changes the output frequency of the first local oscillator, a variable frequency oscillator, a heterodyne frequency oscillator, a fourth mixing circuit that mixes the respective output frequencies of said first carrier frequency oscillator and said variable frequency oscillator and a fifth mixing circuit connected to the first mixing circuit that mixes the respective output frequencies of said fourth mixing circuit and said heterodyne frequency oscillator.

3. An interference eliminator as in claim 2 where said second local oscillator comprises a second carrier frequency oscillator.

4. An interference eliminator as in claim 3 where said third local oscillator includes a third carrier frequency oscillator, a sixth mixing circuit that mixes the respective output frequencies of said first and second carrier frequency oscillators and a seventh mixing circuit that mixes the output frequency of said sixth mixing circuit with the output frequency of said third carrier frequency oscillator and applies the output to said third mixing circuit.

5. An interference eliminator for use in a communication receiver for eliminating interference from a high frequency input signal applied to the receiver, the high frequency input signal extending over a first range of frequencies, said interference eliminator comprising a first mixing circuit responsive to the high frequency input signal for providing a first intermediate frequency signal, a first band-pass filter responsive to the first intermediate frequency signal, a second mixing circuit responsive to the output of said first band-pass filter for providing a second intermediate frequency signal, a second band-pass filter having a center frequency different from the center frequency of said first band-pass filter and responsive to the second intermediate frequency signal, a first local oscillator connected to said first mixing circuit for applying a first local oscillator signal thereto, said first local oscillator including a first carrier frequency oscillator that changes the output frequency of the first local oscillator, a variable frequency oscillator, a heterodyne frequency oscillator, a third mixing circuit that mixes the respective output frequencies of said first carrier frequency oscillator and said variable frequency oscillator and a fourth mixing circuit connected to the first mixing circuit that mixes the respective output frequencies of said third mixing circuit and said heterodyne frequency oscillator, a second local oscillator connected to said second mixing circuit for applying a second local oscillator signal thereto, the relationships between the frequency of said first local oscillator signal to the center frequency and band-pass of the first band-pass filter and the frequency of said second local oscillator signal to the center frequency and band-pass of the second band-pass filter normally being such that the range of frequencies of said high frequency input signal effectively passed by said first and second band-pass filters after conversion by said first and second mixing circuits is such that (a) at least all of said first range of frequencies of the high frequency input signal are effectively passed by the first and second band-pass filters and (b) the center frequency of the range of frequencies effectively passed by the filters is substantially equal to the center frequency of the first range of frequencies, first control means for simultaneously changing said first and second local oscillator frequencies only when said second local oscillator is controlled to change said second local oscillator frequency so that the ratio of the amount of frequency change in said first local oscillator frequency to that in said second local oscillator frequency is 1:2 thereby (a) a reduced range of frequencies of the high frequency input signal is effectively passed by the filters which is less than said first range of frequencies and (b) the center frequency of the reduced range of frequencies effectively passed by the filters is substantially equal to the center frequency of the first range of frequencies, and second control means for changing said first local oscillator frequency without changing the frequency of said second local oscillator so that the center frequency of the reduced range of frequencies effectively passed by the filters is shifted with respect to the center frequency of the first range of frequencies.

6. An interference eliminator for use in a communication receiver for eliminating interference from a high frequency input signal applied to the receiver, the high frequency input signal extending over a first range of frequencies, said interference eliminator comprising a first mixing circuit responsive to the high frequency input signal for providing a first intermediate frequency signal, a first band-pass filter responsive to the first intermediate frequency signal, a second mixing circuit responsive to the output of said first band-pass filter for providing a second intermediate frequency signal, a second band-pass filter having a center frequency different from the center frequency of said first band-pass filter and responsive to the second intermediate frequency signal, a first local oscillator connected to said first mixing circuit for applying a first local oscillator signal thereto, a second local oscillator connected to said second mixing circuit for applying a second local oscillator signal thereto, the relationships between the frequency of said first local oscillator signal to the center frequency and band-pass of the first band-pass filter and the frequency of said second local oscillator signal to the center frequency and band-pass of the second band-pass filter normally being such that the range of frequencies of said high frequency input signal effectively passed by said first and second band-pass filters after conversion by said first and second mixing circuits is such that (a) at least all of said first range of frequencies of the high frequency input signal are effectively passed by the first and second band-pass filters and (b) the center frequency of the range of frequencies effectively passed by the filters is substantially equal to the center frequency of the first range of frequencies, first control means for simultaneously changing said first and second local oscillator frequencies only when said second local oscillator is controlled to change said second local oscillator frequency so that the ratio of the amount of frequency change in said first local oscillator frequency to that in said second local oscillator frequency is 1:2 thereby (a) a reduced range of frequencies of the high frequency input signal is effectively passed by the filters which is less than said first range of frequencies and (b) the center frequency of the reduced range of frequencies effectively passed by the filters is substantially equal to the center frequency of the first range of frequencies, said first control means including a first variable member for controlling the frequency of said second local oscillator, a second variable member for controlling the frequency of said first local oscillator and means for interlocking said first variable member with said second variable member so that said second variable member is changed only when said first variable member is changed, and second control means for changing said first local oscillator frequency without changing the frequency of said second local oscillator so that the center frequency of the reduced range of frequencies effectively passed by the filters is shifted with respect to the center frequency of the first range of frequencies.

7. An interference eliminator as in claim 6 where said first and second variable members are interlocked variable resistors.

8. An interference eliminator as in claims 6 or 7 where said second control means includes a third variable member for controlling the frequency of said first local oscillator.

9. An interference eliminator as in claim 8 where said third variable member is a variable resistor.

* * * * *